(12) United States Patent
Yang

(10) Patent No.: US 7,425,736 B2
(45) Date of Patent: Sep. 16, 2008

(54) SILICON LAYER WITH HIGH RESISTANCE AND FABRICATING METHOD THEREOF

(75) Inventor: Yu-Chi Yang, Miao-Li Hsiang (TW)

(73) Assignee: United Microelectronics Corp., Hsinchu (TW)

( * ) Notice: Subject to any disclaimer, the term of this patent is extended or adjusted under 35 U.S.C. 154(b) by 414 days.

(21) Appl. No.: 11/160,046

(22) Filed: Jun. 7, 2005

(65) Prior Publication Data

US 2006/0273322 A1    Dec. 7, 2006

(51) Int. Cl.
*H01L 29/76* (2006.01)
(52) U.S. Cl. ...................................... 257/288; 257/364
(58) Field of Classification Search ......... 257/536–538, 257/635, 646, 656, 288, 364
See application file for complete search history.

(56) References Cited

U.S. PATENT DOCUMENTS

| | | | | |
|---|---|---|---|---|
| 5,298,436 A | * | 3/1994 | Radosevich et al. | 438/396 |
| 5,332,689 A | * | 7/1994 | Sandhu et al. | 438/491 |
| 5,587,696 A | | 12/1996 | Su et al. | 338/314 |
| 6,610,361 B1 | * | 8/2003 | Heuer et al. | 427/255.18 |

* cited by examiner

*Primary Examiner*—Tuan H Nguyen
(74) *Attorney, Agent, or Firm*—Jianq Chyun IP Office

(57) ABSTRACT

A silicon layer with high resistance is provided. The silicon layer with high resistance is positioned on a substrate. Also, the silicon layer with high resistance includes a plurality of silicon material layers, and an interface layer between every two of the silicon material layers, wherein, the silicon material layers and the interface layer have dopants therein. The amount of implanted dopants is about $1*10^{14} \sim 5*10^{15}$ ions/$cm^2$, and the silicon material layers have different grain boundaries.

10 Claims, 1 Drawing Sheet

SILICON LAYER WITH HIGH RESISTANCE AND FABRICATING METHOD THEREOF

BACKGROUND OF THE INVENTION

1. Field of the Invention

The present invention relates to a silicon layer with high resistance and a fabricating method thereof.

2. Description of the Related Art

In an integrated circuit process, a silicon layer plays an important role, especially in an application to a gate of a metal oxide semiconductor (MOS) or an interconnect structure. Generally speaking, the fabrication method of a silicon layer is to perform a chemical vapor deposition (CVD) process to form a silicon material layer, followed by performing an ion implantation process to implant dopants therein for increasing conductivity of the silicon material layer.

It is noted that the conductivity of the silicon layer is related to the amount of the dopants implanted therein. In general, if we want to fabricate a silicon layer with high resistance, the amount of dopants implanted must be decreased. However, when the amount of the implanted dopants becomes less, variations of the conductivity between silicon layers become larger. Since these silicon layers are fabricated with the same implantation process, but on different wafers, the reliability of devices containing these silicon layers is poor.

SUMMARY OF THE INVENTION

Accordingly, the present invention provides a silicon layer with high resistance and a fabricating method thereof to improve the reliability of devices containing the silicon layer.

The silicon layer with high resistance is described as follows. The silicon layer with high resistance is located on a substrate. Also, the silicon layer with high resistance includes a plurality of silicon material layers, and an interface layer between every two silicon material layers. The silicon material layers and the interface layer have dopants therein, wherein the amount of the implanted dopants is about $1*10^{14}$~$5*10^{15}$ ions/cm$^2$, and the silicon material layers have different grain boundaries.

The method of fabricating a silicon layer with high resistance is described as follows. A silicon layer is formed on a substrate, and dopants are implanted therein, wherein the amount of the implanted dopants is about $1*10^{14}$~$5*10^{15}$ ions/cm2. In addition, the method of fabricating the silicon layer includes forming a silicon material layer on the substrate, forming an interface layer different from the silicon material layer thereon, and forming another silicon material layer on the interface layer.

The silicon layer of this invention may include many silicon material layers. Also, the grain boundary of the upper silicon material layer can be changed by forming the interface layer on the lower silicon material layer. Therefore, the total resistance of the silicon layer can be increased. In addition, variations of the conductivity between silicon layers, which are fabricated with the same implantation process but on different wafers, can be decreased. Accordingly, the reliability of devices containing the silicon layer of the invention can be improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
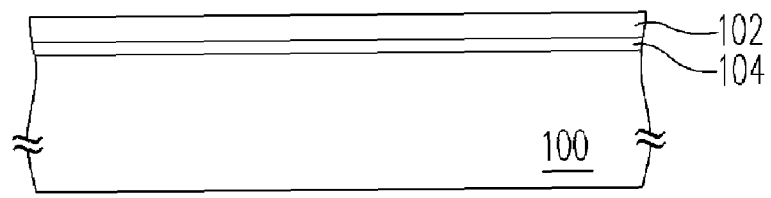
FIGS. 1A through 1D are schematic cross-sectional views showing the steps of fabricating a silicon layer with high resistance according to a preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are schematic cross-sectional views showing the steps of fabricating a silicon layer with high resistance according to a preferred embodiment of this invention. As shown in FIG. 1A, a silicon material layer 102 is formed on a substrate 100, wherein, the substrate 100 is formed with, for example, a dielectric layer 104 thereon, and a portion of the silicon material layer 102 is at least located on the dielectric layer 104. The dielectric layer 104 may be a gate dielectric layer, a shallow trench isolation (STI) or a field oxide isolation. In this embodiment, the silicon material layer 102 is located on the gate dielectric layer, for example. In addition, the silicon material layer 102 may be an amorphous silicon layer or a polysilicon layer formed with, for example, chemical vapor deposition (CVD). The silicon material layer 102 may be at least 200 Å thick.

Figure 1B:
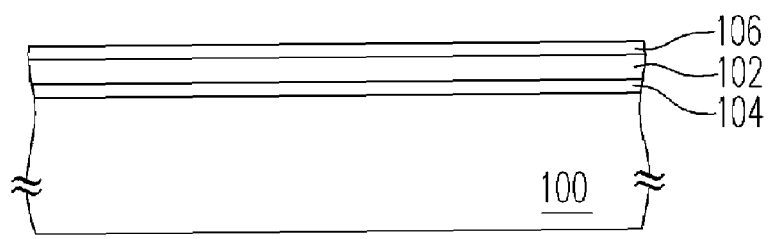

Thereafter, as shown in FIG. 1B, an interface layer 106 is formed on the silicon material layer 102, and the interface layer 106 is different from the silicon material layer 102. It is noted that the material of the interface layer 106 has no special limitation. It means that any layer with material different from that of the silicon material layer 102 can be used. In one embodiment, the interface layer 106 may be a silicon nitride layer or a silicon oxide layer. The method of forming the interface layer 106 is, for example, using ammonia to form a silicon nitride layer, using a gas containing oxygen to form a silicon oxide layer, or removing a wafer from a chamber and placing it inside the chamber again to form a silicon oxide layer by contacting with air. The thickness of the interface layer 106 is 0~30 Å, for example. In one preferred embodiment, the thickness of the interface layer 106 is 0~20 Å, for example. In one further preferred embodiment, the thickness of the interface layer 106 is 0~10 Å, for example.

Figure 1C:
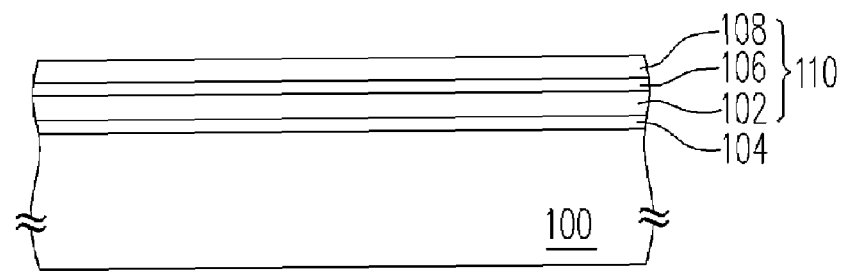

Then, as shown in FIG. 1C, another silicon material layer 108 is formed on the interface layer 106 to form a silicon layer 110 that includes the silicon material layer 102, the interface layer 106 and the silicon material layer 108, wherein, the silicon material layer 108 may be an amorphous silicon layer or a polysilicon layer formed with, for example, CVD. The total thickness of the silicon layer 110 is smaller than 5000 Å.

It is noted that a material of the interface layer 106 different from that of the silicon material layer 102 is formed thereon, so that a layer, such as silicon material layer 108, formed on the interface layer 106 would have a different grain boundary from that of the silicon material layer 102. In other words, the grain boundaries of these silicon material layers 102 and 108 are discontinuous, and the total resistance of the silicon layer 110 can be increased. Therefore, in this invention, the total resistance of the silicon layer 110 can be increased by stacking many silicon material layers with discontinuous grain boundaries.

In addition, in another embodiment, after forming the silicon material layers 108, the steps of forming the interface layer 106 and the silicon material layer 108 may be repeated for several times. It is noted that an interface layer is present between every two silicon material layers, and the interface layer having a different grain boundary from that of the lower silicon material layer can change the grain boundary of the upper silicon material layer. Therefore, the method of forming the upper silicon material layer has no special limitation. In other words, the method of forming the upper silicon material layer may be the same with that of the lower silicon material layer, or different from that of the lower silicon material layer.

Figure 1D:
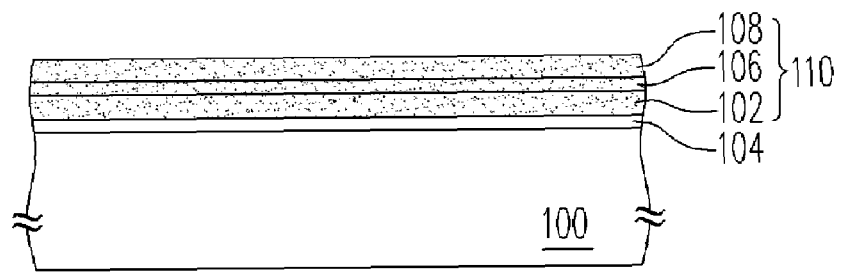

Thereafter, as shown in FIG. 1D, dopants are implanted in the silicon layer 110 for decreasing its resistance appropriately. The amount of dopants implanted is $1*10^{14}$~$5*10^{15}$ ions/cm$^2$, and the dopants may be boron (B), boron difluoride (BF$_2$), phosphorous (P) or arsenic (As). It is noted that when the dopants are implanted in the silicon layer 110, besides being implanted in the uppermost layer, such as the silicon material layer 108, the dopants are also implanted in the interface layer 106 and the silicon material layer 102 under the uppermost layer. Therefore, silicon material layer 102 and 108 are electrically connected due to the implanted dopants.

In one embodiment, after implanting dopants in the silicon layer 110, the method of the invention further comprises performing a thermal process on the silicon layer 110, wherein, the thermal process may be an annealing process. In addition, if the silicon material layer is an amorphous silicon layer, after the thermal process, it would become a polysilicon layer.

The structure of the silicon layer with high resistance fabricated with the above method is described as follows.

As shown in FIG. 1D, the silicon layer 110 with high resistance of this invention is located on the substrate 100. Also, the silicon layer 110 with high resistance is formed with the silicon material layers 102, 108, and the interface layer 106 between the silicon material layers 102 and 108. The silicon material layer 102 may be at least 200 Å thick. In addition, the interface layer 106 is about 0~30 Å thick, for example. In one preferred embodiment, the interface layer 106 is about 0~20 Å thick, for example. In one further preferred embodiment, the interface layer 106 is about 0~10 Å thick, for example. Furthermore, the thickness of the silicon layer 110 is smaller than 5000 Å.

Also, the silicon material layers 102, 108 and the interface layer 106 have dopants therein, and the amount of implanted dopants is about $1*10^{14}$~$5*10^{15}$ ions/cm$^2$. As a result, the silicon material layers 102 and 108 have different grain boundaries.

In one embodiment, the silicon layer 110 with high resistance further comprises the dielectric layer 104 located on the substrate 100, and a portion of the silicon layer 110 is at least located thereon. The dielectric layer 104 may be a gate dielectric layer, a shallow trench isolation (STI) or a field oxide isolation. In this embodiment, the silicon layer 110 is located on the gate dielectric layer, for example.

Although the above embodiments refers to the silicon layer only having two silicon material layers to, it is to be understood that these embodiments are presented by way of example and not by way of limitation. The silicon layer of this invention can be a structure containing multi-silicon material layers, and an interface layer between every two of the silicon material layers.

Accordingly, the silicon layer of this invention may include many silicon material layers. Also, the grain boundary of the upper silicon material layer can be changed by forming the interface layer on the lower silicon material layer. Therefore, the total resistance of the silicon layer can be increased. In addition, variations of the conductivity between silicon layers, which are fabricated with the same implantation process, but on different wafers, can be decreased. Accordingly, the reliability of devices containing the silicon layer of the invention can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A silicon layer with a high resistance disposed on a substrate, comprising:
    a plurality of silicon material layers; and
    an interface layer between every two of the silicon material layers, wherein the silicon material layers and the interface layer have dopants therein, an amount of the dopants is about $1*10^{14}$~$5*10^{15}$ ions/cm$^2$, the silicon material layers have different grain boundaries, and materials of the interface layers are different from materials of the silicon material layers.

2. The silicon layer according to claim 1, wherein a thickness of the interface layer is more than 0 to about 30 Å.

3. The silicon layer according to claim 1, wherein a thickness of the interface layer is more than 0 to about 20 Å.

4. The silicon layer according to claim 1, wherein a thickness of the interface layer is more than 0 to about 10 Å.

5. The silicon layer according to claim 1, wherein the dopants comprise boron (B), boron difluoride (BF$_2$), phosphorous (P) or arsenic (As).

6. The silicon layer according to claim 1, further comprising a dielectric layer disposed on the substrate, wherein a portion of the silicon is at least disposed on the dielectric layer.

7. The silicon according to claim 6, wherein the dielectric layer comprises a gate dielectric layer, a shallow trench isolation (STI) or a field oxide isolation.

8. The silicon layer according to claim 1, wherein a thickness of the silicon layer is smaller than 5000 Å.

9. The silicon layer according to claim 1, wherein a thickness of the lowest silicon material layer is at least 200 Å.

10. The silicon layer according to claim 1, wherein the interface layer is a silicon oxide layer or silicon nitride layer.

* * * * *